United States Patent
Yoshizumi et al.

(10) Patent No.: US 9,226,381 B2
(45) Date of Patent: Dec. 29, 2015

(54) HEAT-TRANSFER PLATE, HEAT-TRANSFER PLATE MODULE, AND SUBMARINE APPARATUS

(71) Applicant: FUJITSU LIMITED, Kawasaki-shi, Kanagawa (JP)

(72) Inventors: Takahisa Yoshizumi, Fukuoka (JP); Naoto Hoshiyama, Tama (JP)

(73) Assignee: FUJITSU LIMITED, Kawasaki (JP)

( * ) Notice: Subject to any disclaimer, the term of this patent is extended or adjusted under 35 U.S.C. 154(b) by 71 days.

(21) Appl. No.: 14/284,920

(22) Filed: May 22, 2014

(65) Prior Publication Data
US 2014/0369004 A1    Dec. 18, 2014

(30) Foreign Application Priority Data
Jun. 12, 2013    (JP) .................. 2013-123754

(51) Int. Cl.
*G06F 1/16*    (2006.01)
*H05K 5/00*    (2006.01)
*H05K 7/00*    (2006.01)
(Continued)

(52) U.S. Cl.
CPC ............ *H05K 1/0204* (2013.01); *H05K 1/0201* (2013.01); *H05K 7/20463* (2013.01); *G02B 6/4448* (2013.01); *G02B 6/506* (2013.01); *H05K 3/0061* (2013.01); *H05K 3/284* (2013.01); *H05K 2201/064* (2013.01)

(58) Field of Classification Search
CPC ............ G06F 1/20; G06F 1/203; G06F 1/206
USPC .......................... 361/681, 699, 700, 708, 709
See application file for complete search history.

(56) References Cited

U.S. PATENT DOCUMENTS 4,396,936 A * 8/1983 McIver ............... H01L 23/3736
174/252
5,467,251 A * 11/1995 Katchmar ........... H01L 23/3672
174/252
(Continued)

FOREIGN PATENT DOCUMENTS

| JP | 8-111568 | 4/1996 |
| JP | 2001-144449 | 5/2001 |
| JP | 2004-222426 | 8/2004 |

OTHER PUBLICATIONS

Extended European Search Report issued Apr. 10, 2015 in corresponding European Patent Application No. 14170755.4.

*Primary Examiner* — Anthony Haughton
(74) *Attorney, Agent, or Firm* — Staas & Halsey LLP

(57) ABSTRACT

A heat-transfer plate includes a pool portion configured to have a partially-depressed surface and to be loaded with thermally-conductive resin that is in contact with a heating component so as to transfer the heat from the heating component to the heat-transfer plate, a resin-amount check portion configured to have a plurality of depths and to be disposed at a position where the thermally-conductive resin is viewable in a state where the printed circuit board is fixed to the heat-transfer plate, a levee portion configured to be provided between the pool portion and the resin-amount check portion and to suppress flow of the thermally-conductive resin toward the resin-amount check portion, and a flow channel configured to be provided between the pool portion and the resin-amount check portion and to serve as a path through which the thermally-conductive resin flowing into the resin-amount check portion from the pool portion travels.

8 Claims, 19 Drawing Sheets

(51) Int. Cl.
*H05K 1/02* (2006.01)
*H05K 7/20* (2006.01)
*G02B 6/44* (2006.01)
*G02B 6/50* (2006.01)
*H05K 3/00* (2006.01)
*H05K 3/28* (2006.01)

(56) References Cited

U.S. PATENT DOCUMENTS

| | | | | |
|---|---|---|---|---|
| 5,646,826 A | * | 7/1997 | Katchmar | H01L 23/4006 165/185 |
| 5,796,582 A | * | 8/1998 | Katchmar | H05K 7/20509 165/185 |
| 6,212,076 B1 | * | 4/2001 | MacQuarrie | H05K 1/0207 174/252 |
| 6,335,862 B1 | | 1/2002 | Koya | |
| 6,896,045 B2 | * | 5/2005 | Panek | F28F 13/00 165/185 |
| 7,436,584 B2 | * | 10/2008 | Young | G02B 6/4428 359/333 |
| 7,606,038 B2 | * | 10/2009 | Sugimura | H05K 1/0206 257/706 |
| 8,891,242 B2 | * | 11/2014 | Borrat-Michaud | H05K 7/20154 165/104.33 |
| 2003/0161111 A1 | | 8/2003 | Yoshida et al. | |
| 2004/0070946 A1 | | 4/2004 | Matsuo et al. | |
| 2005/0036751 A1 | | 2/2005 | Young et al. | |
| 2009/0059498 A1 | | 3/2009 | Jeong et al. | |

* cited by examiner

HEAT-TRANSFER PLATE, HEAT-TRANSFER PLATE MODULE, AND SUBMARINE APPARATUS

CROSS-REFERENCE TO RELATED APPLICATION

This application is based upon and claims the benefit of priority of the prior Japanese Patent Application No. 2013-123754, filed on Jun. 12, 2013, the entire contents of which are incorporated herein by reference.

FIELD

The embodiments discussed herein are related to heat-transfer plates, heat-transfer plate modules, and submarine apparatuses.

BACKGROUND

Japanese Laid-open Patent Publication No. 2001-144449 discloses a technology in which thermally-conductive resin is loaded between an electronic component and a planar thermal conductor, and the loaded state of the thermally-conductive resin may be checked through a check hole. With this technology, heat generated at the electronic component is made to escape to the planar thermal conductor via the thermally-conductive resin. Japanese Laid-open Patent Publication No. 2004-222426 discloses a technology in which a submarine apparatus is provided with a layer formed of a thermally-conductive mesh material between an internal unit and an external housing. With this technology, heat generated at the internal unit is made to escape to the external housing via the thermally-conductive mesh layer.

SUMMARY

According to an aspect of the invention, a heat-transfer plate that is fixed to a printed circuit board mounted with a heating component and that radiates heat from the heating component, the heat-transfer plate includes a pool portion configured to have a partially-depressed surface and to be loaded with thermally-conductive resin that is in contact with the heating component so as to transfer the heat from the heating component to the heat-transfer plate, a resin-amount check portion configured to have a plurality of depths and to be disposed at a position where the thermally-conductive resin is viewable in a state where the printed circuit board is fixed to the heat-transfer plate, a levee portion configured to be provided between the pool portion and the resin-amount check portion and to suppress flow of the thermally-conductive resin toward the resin-amount check portion, and a flow channel configured to be provided between the pool portion and the resin-amount check portion and to serve as a path through which the thermally-conductive resin flowing into the resin-amount check portion from the pool portion travels.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a technology in which thermally-conductive resin is loaded between an electronic component and a planar thermal conductor and heat generated at the electronic component is made to escape to the thermal conductor, it may be difficult to check whether or not an air bubble is contained in the thermally-conductive resin. If an air bubble is contained in the thermally-conductive resin, the thermal conductivity of the thermally-conductive resin would decrease, thus making it difficult to allow the heat generated at the electronic component to efficiently escape to the thermal conductor.

Preferred embodiments of a heat-transfer plate, a heat-transfer plate module, and a submarine apparatus that allow for checking of whether or not the thermally-conductive resin loaded therein contains an air bubble will be described below with reference to the appended drawings.

First Embodiment

Figure 1:
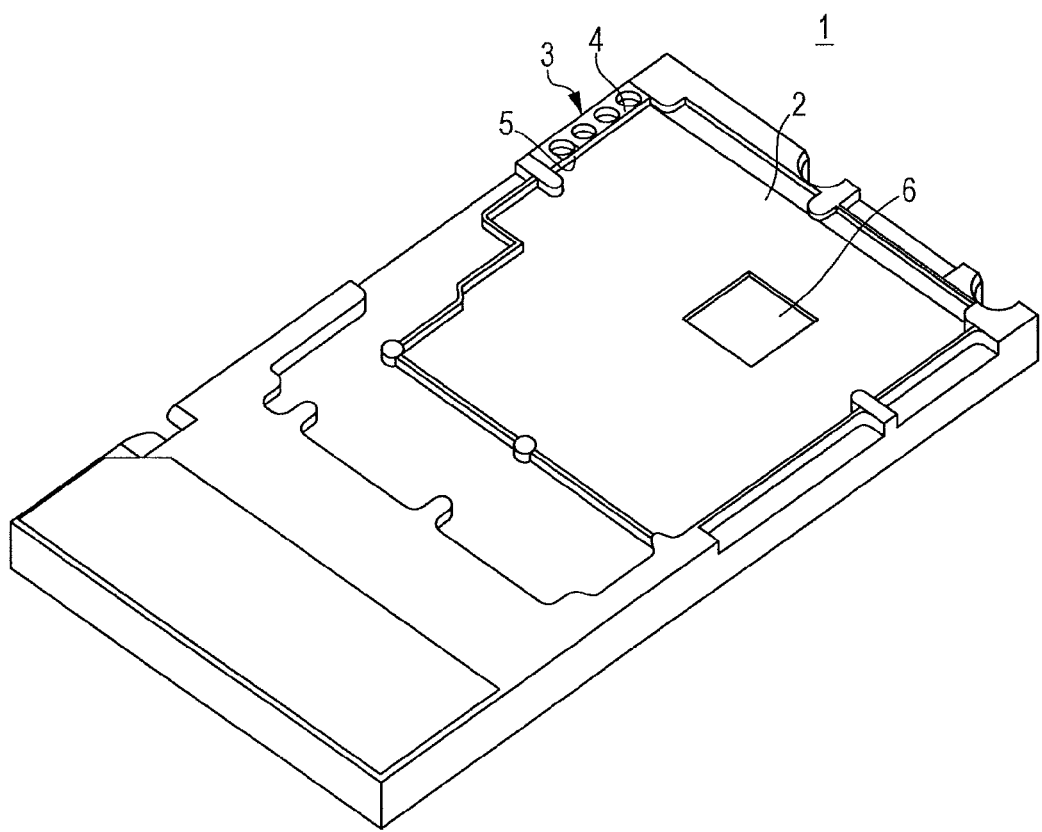
FIG. 1 illustrates an example of a heat-transfer plate according to a first embodiment.
Figure 2:
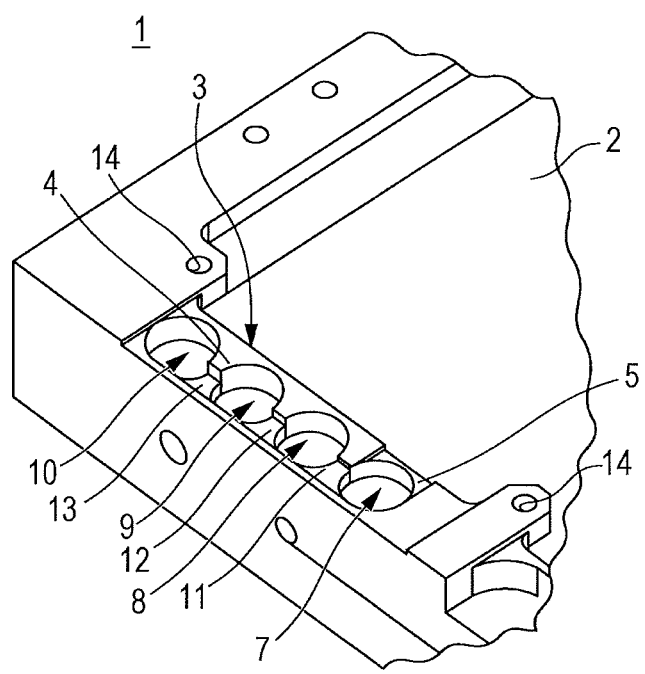
FIG. 2 illustrates a first example of a resin-amount check portion in the heat-transfer plate according to the first embodiment.
Figure 3:
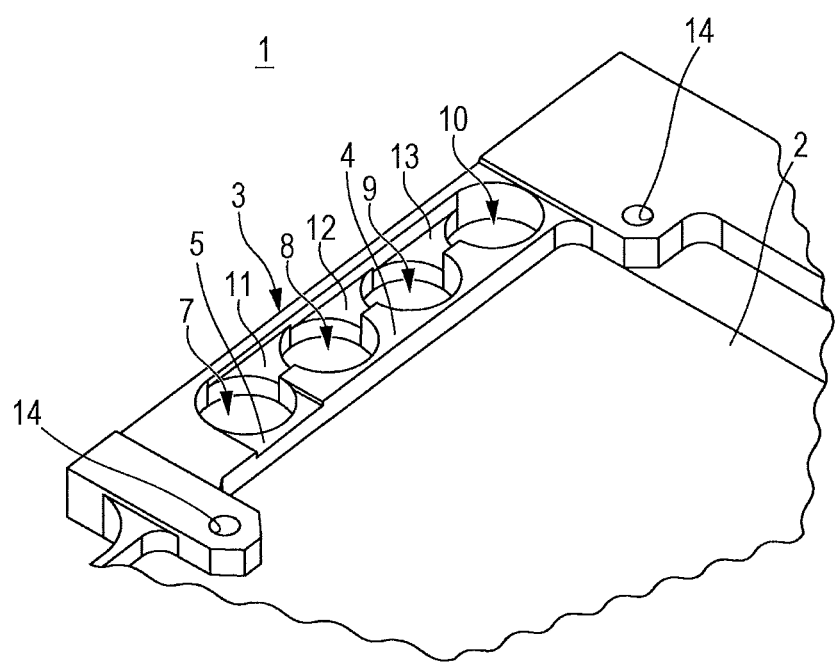
FIG. 3 illustrates the first example of the resin-amount check portion in the heat-transfer plate according to the first embodiment.

FIG. 1 illustrates an example of a heat-transfer plate according to a first embodiment. FIGS. 2 and 3 illustrate a first example of a resin-amount check portion in the heat-transfer plate according to the first embodiment.

As illustrated in FIGS. 1 to 3, a heat-transfer plate 1 has a pool portion 2, a resin-amount check portion 3, a levee portion 4, and a flow channel 5. The heat-transfer plate 1 is fixed to a printed circuit board (not illustrated) mounted with heat-generating heating components and radiates the heat from the heating components. The heat-transfer plate 1 is composed of a material with high thermal conductivity. For example, the heat-transfer plate 1 may be composed of metal, such as copper, aluminum, stainless steel, a titanium alloy, or beryllium copper. Alternatively, the heat-transfer plate 1 may be composed of a resin material that does not produce outgas.

The pool portion 2 is provided by depressing a part of a surface of the heat-transfer plate 1. The pool portion 2 may have a recess 6 in one area that is deeper than the remaining area. The pool portion 2 is to be loaded with thermally-conductive resin (not illustrated) having high thermal conductivity. The thermally-conductive resin comes into contact with the heating components of the printed circuit board and transfers the heat from the heating components to the heat-transfer plate 1. In the printed circuit board (not illustrated), a heating component with a large component height may be disposed at a position corresponding to the recess 6 in the pool portion 2, and a heating component with a small component height may be disposed at a position corresponding to an area other than the recess 6 in the pool portion 2.

The resin-amount check portion 3 is positioned where the thermally-conductive resin is viewable in the state where the printed circuit board is fixed to the heat-transfer plate 1. For example, in the example illustrated in FIG. 1, the resin-amount check portion 3 is provided between the pool portion 2 and an area along one edge of the heat-transfer plate 1 that is not covered by the printed circuit board. The resin-amount check portion 3 has multiple depths. An operator may check the amount of thermally-conductive resin based on how much the thermally-conductive resin is accumulated in the resin-amount check portion 3.

In the first example of the resin-amount check portion 3, the resin-amount check portion 3 may have multiple recessed measurement portions 7 to 10 having different depths. For example, in the example illustrated in FIGS. 1 to 3, the resin-amount check portion 3 is provided with four measurement portions, namely, a first measurement portion 7, a second measurement portion 8, a third measurement portion 9, and a fourth measurement portion 10. The measurement portions 7 to 10 may have the same capacity or different capacities. For example, the capacity of each of the measurement portions 7 to 10 may be about 0.1 cc. The shape of each of the measurement portions 7 to 10 is not limited to a cylindrical shape, but may be any shape so long as the thermally-conductive resin may be accumulated therein.

The levee portion 4 is provided between the pool portion 2 and the resin-amount check portion 3 and extends upright from the bottom of the pool portion 2. The levee portion 4 suppresses flow of the thermally-conductive resin from the pool portion 2 toward the resin-amount check portion 3.

The flow channel 5 is provided between the pool portion 2 and the resin-amount check portion 3. The flow channel 5 serves as a path through which the thermally-conductive resin flows into the resin-amount check portion 3 from the pool portion 2. In other words, the thermally-conductive resin flows into the resin-amount check portion 3 from the pool portion 2 by traveling through the flow channel 5. In the levee portion 4, an area thereof that is lower than the periphery of the pool portion 2 serves as the flow channel 5. In the first example of the resin-amount check portion 3, for example, an area of the levee portion 4 that corresponds to the first measurement portion 7 is lower than the periphery of the pool portion 2. Therefore, the thermally-conductive resin spilling over the pool portion 2 travels through the flow channel 5 so as to flow into the first measurement portion 7 of the resin-amount check portion 3.

In the levee portion 4, a second flow channel 11 that is lower than the flow channel 5 is provided in an area between the first measurement portion 7 and the second measurement portion 8. The thermally-conductive resin spilling over the first measurement portion 7 travels through the second flow channel 11 so as to flow into the second measurement portion 8. Likewise, the thermally-conductive resin spilling over the second measurement portion 8 travels through a third flow channel 12, which is provided between the second measurement portion 8 and the third measurement portion 9 and is lower than the second flow channel 11, so as to flow into the third measurement portion 9. The thermally-conductive resin spilling over the third measurement portion 9 travels through a fourth flow channel 13, which is provided between the third measurement portion 9 and the fourth measurement portion 10 and is lower than the third flow channel 12, so as to flow into the fourth measurement portion 10.

When the thermally-conductive resin accumulates in the pool portion 2 and the heating components of the printed circuit board are immersed into the thermally-conductive resin in the pool portion 2, the thermally-conductive resin spills over the pool portion 2. For example, a state where the first measurement portion 7 is filled with the thermally-conductive resin spilling over the pool portion 2, the thermally-conductive resin spilling over the first measurement portion 7 accumulates in the second measurement portion 8, and the third and fourth measurement portions 9 and 10 are empty may be defined as a preferred state. If the heating components are not sufficiently immersed in the thermally-conductive resin in the pool portion 2, the amount of thermally-conductive resin spilling over the pool portion 2 decreases. Thus, for example, the thermally-conductive resin accumulates in the first measurement portion 7, but the second to fourth measurement portions 8 to 10 are empty.

On the other hand, if the thermally-conductive resin in the pool portion 2 contains an air bubble, the amount of thermally-conductive resin spilling over the pool portion 2 increases. Thus, for example, the first measurement portion 7 and the second measurement portion 8 become filled with the thermally-conductive resin, the thermally-conductive resin accumulates in the third measurement portion 9, and the fourth measurement portion 10 is empty. If there are many air bubbles contained in the thermally-conductive resin, the third measurement portion 9 may also become filled with the thermally-conductive resin, and the thermally-conductive resin may accumulate in the fourth measurement portion 10.

Alternatively, for example, a state where the first measurement portion 7 and the second measurement portion 8 are filled with the thermally-conductive resin spilling over the pool portion 2, the thermally-conductive resin spilling over the second measurement portion 8 accumulates in the third measurement portion 9, and the fourth measurement portion 10 is empty may be defined as a preferred state. For example, if the heating component with the large height is immersed in the thermally-conductive resin in the pool portion 2 but the heating component with the small height is not immersed in the thermally-conductive resin, the amount of thermally-conductive resin spilling over the pool portion 2 decreases significantly. Thus, for example, the thermally-conductive resin accumulates in the first measurement portion 7, but the second to fourth measurement portions 8 to 10 are empty.

If the heating component with the large height and the heating component with the small height are both immersed in the thermally-conductive resin in the pool portion 2 but are not sufficiently immersed therein, the amount of thermally-conductive resin spilling over the pool portion 2 decreases. Thus, for example, the first measurement portion 7 becomes filled with the thermally-conductive resin, the thermally-conductive resin accumulates in the second measurement portion 8, and the third and fourth measurement portions 9 and 10 are empty.

If an air bubble is contained in the thermally-conductive resin in the pool portion 2, the amount of thermally-conductive resin spilling over the pool portion 2 increases. Thus, for example, the first to third measurement portions 7 to 9 become filled with the thermally-conductive resin, and the thermally-conductive resin accumulates in the fourth measurement portion 10. If there are many air bubbles contained in the thermally-conductive resin, the fourth measurement portion 10 may also become filled with the thermally-conductive resin.

The number of measurement portions may be three, or may be five or more. For example, it is assumed that three measurement portions are provided, namely, the first measurement portion 7, the second measurement portion 8 and the third measurement portion 9. In that case, a state where the first measurement portion 7 becomes filled with the thermally-conductive resin spilling over the pool portion 2, the thermally-conductive resin spilling over the first measurement portion 7 accumulates in the second measurement portion 8, and the third measurement portion 9 is empty may be defined as a preferred state.

According to the heat-transfer plate 1 illustrated in FIGS. 1 to 3, since the resin-amount check portion 3 is not covered with the printed circuit board, the operator may visually check the resin-amount check portion 3 even when the printed circuit board is attached to the heat-transfer plate 1. Furthermore, if the thermally-conductive resin loaded in the pool portion 2 contains an air bubble during the attachment process of the printed circuit board, the amount of thermally-conductive resin spilling over the pool portion 2 and accumulated in the resin-amount check portion 3 would increase. Thus, the operator may check the amount of thermally-conductive resin accumulated in the resin-amount check portion 3 during the attachment process of the printed circuit board so as to check whether or not an air bubble is contained in the thermally-conductive resin loaded in the pool portion 2. In other words, the operator may confirm that there are no air bubbles contained in the thermally-conductive resin loaded in the pool portion 2.

Furthermore, according to the heat-transfer plate 1 illustrated in FIGS. 1 to 3, the operator may check the amount of thermally-conductive resin accumulated in the resin-amount check portion 3 during the attachment process of the printed circuit board so as to check whether or not the heating components of the printed circuit board are sufficiently immersed in the thermally-conductive resin in the pool portion 2. Moreover, according to the heat-transfer plate 1 illustrated in FIGS. 1 to 3, since the resin-amount check portion 3 has multiple measurement portions 7 to 10, the amount of thermally-conductive resin accumulated in the resin-amount check portion 3 may be checked with high accuracy. Furthermore, according to the heat-transfer plate 1 illustrated in FIGS. 1 to 3, since the area of the levee portion 4 that is lower than the periphery of the pool portion 2 serves as the flow channel 5, the thermally-conductive resin may be made to flow from the pool portion 2 to the resin-amount check portion 3 when the heating components are immersed into the thermally-conductive resin in the pool portion 2.

Figure 4:
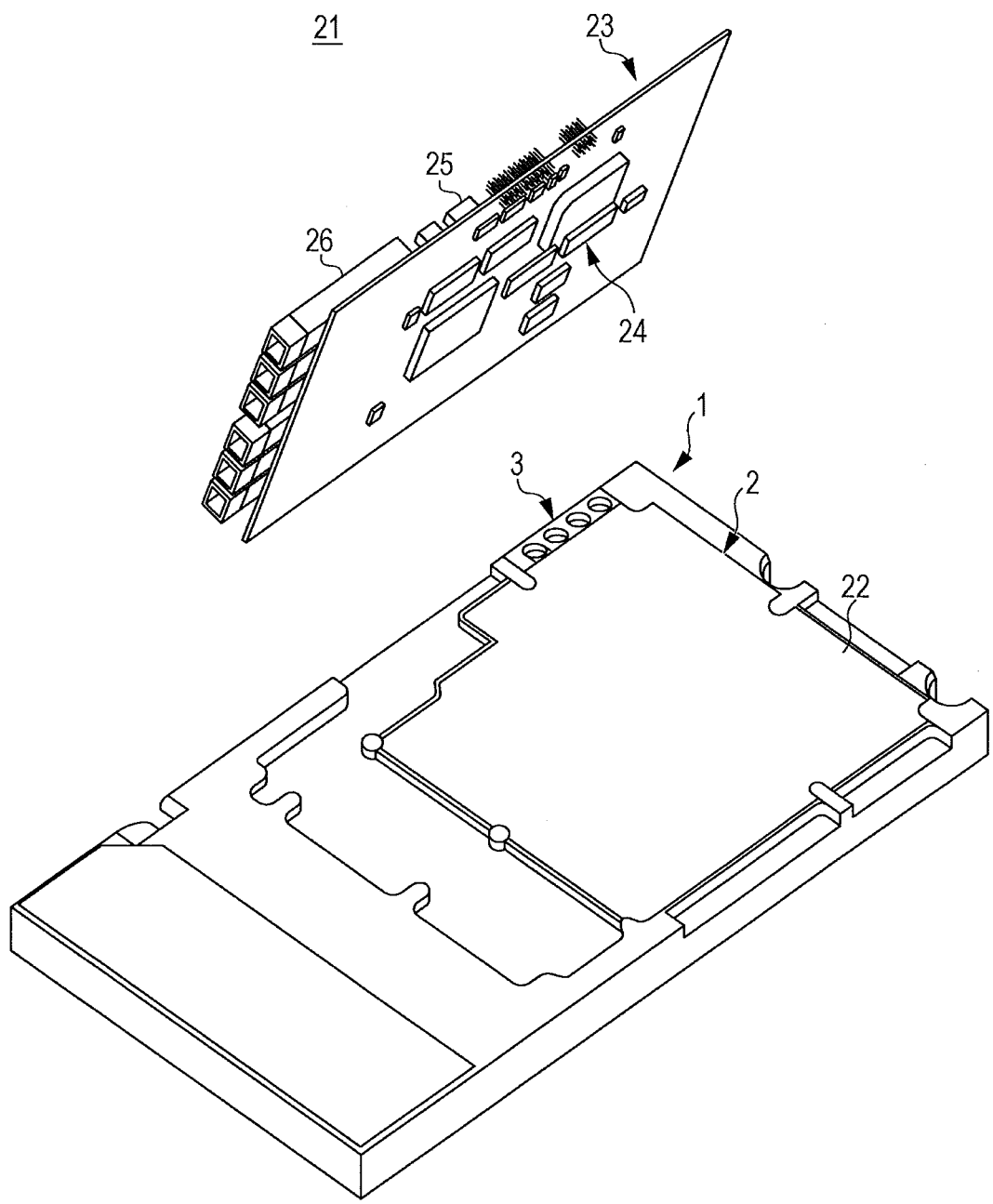
FIG. 4 illustrates an example of a heat-transfer plate module according to embodiments.
Figure 5:
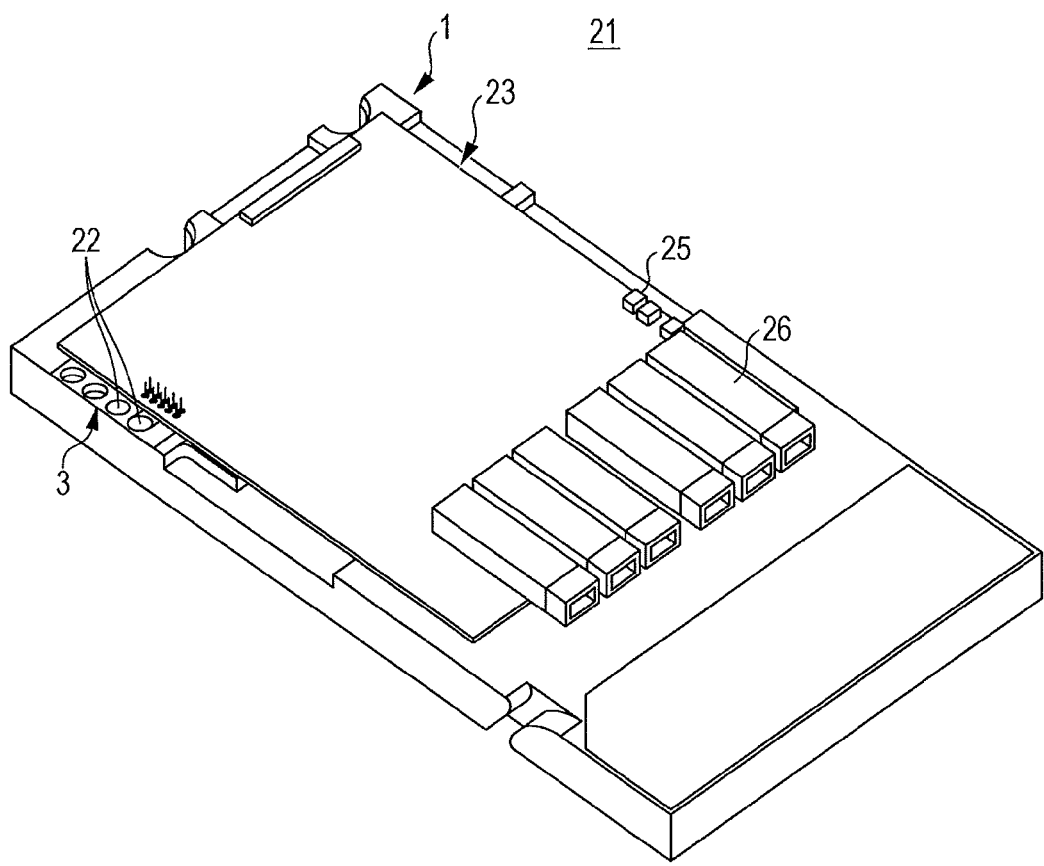
FIG. 5 illustrates the example of the heat-transfer plate module according to embodiments.

FIGS. 4 and 5 illustrate an example of a heat-transfer plate module according to embodiments. FIG. 4 illustrates a state where the printed circuit board is not attached to the heat-transfer plate yet, and FIG. 5 illustrates a state where the printed circuit board is attached to the heat-transfer plate. As illustrated in FIGS. 4 and 5, a heat-transfer plate module 21 includes, for example, the heat-transfer plate 1 illustrated in FIGS. 1 to 3, thermally-conductive resin 22, and a printed circuit board 23.

The thermally-conductive resin 22 is to be accumulated into the pool portion 2 of the heat-transfer plate 1. The thermally-conductive resin 22 has fluidity and is in the form of liquid or sol when being accumulated into the pool portion 2 of the heat-transfer plate 1, and subsequently solidifies. As an example of the thermally-conductive resin 22, for example, ceramic filler silicone, such as 65-00-1642-0000 of CHO-THERM 1642 (manufactured by Chomerics Ltd.) or 65-00-1641-0000 of CHO-THERM 1641 (manufactured by Chomerics Ltd.), may be used.

In a state where the printed circuit board 23 is not attached to the heat-transfer plate 1 yet, the liquid level of the thermally-conductive resin 22 in the pool portion 2 may be, for example, lower than the height of the flow channel 5 in the levee portion 4 or equal to the height of the flow channel 5 in the levee portion 4. Thus, in the state where the printed circuit board 23 is not attached to the heat-transfer plate 1 yet, the thermally-conductive resin 22 does not flow into the resin-amount check portion 3. In other words, in the state where the printed circuit board 23 is not attached to the heat-transfer plate 1 yet, the resin-amount check portion 3 is empty.

The surface of the printed circuit board 23 that faces the heat-transfer plate 1 is mounted with heating components 24. The heating components 24 may include a heating component with a large height and a heating component with a small height. The heating components 24 may be surface mounting devices (SMDs) or insertion mounting devices (IMDs). In a state where the printed circuit board 23 is attached to the heat-transfer plate 1, the heating components 24 are immersed in the thermally-conductive resin 22 within the pool portion 2.

The surface of the printed circuit board 23 opposite the surface thereof facing the heat-transfer plate 1 has attached thereto various electronic-circuit components 25 and optical-communication components 26, such as optical connectors. With regard to the electronic-circuit components 25 and the optical-communication components 26, some of the components are illustrated, whereas the remaining components have been omitted from the drawings.

The printed circuit board 23 may be fixed to the heat-transfer plate 1 by using, for example, screw members (not illustrated). In FIGS. 2 and 3, reference numeral 14 denotes screw holes provided in the heat-transfer plate 1 for receiving the screw members used for fixing the printed circuit board 23 to the heat-transfer plate 1.

Figure 6:
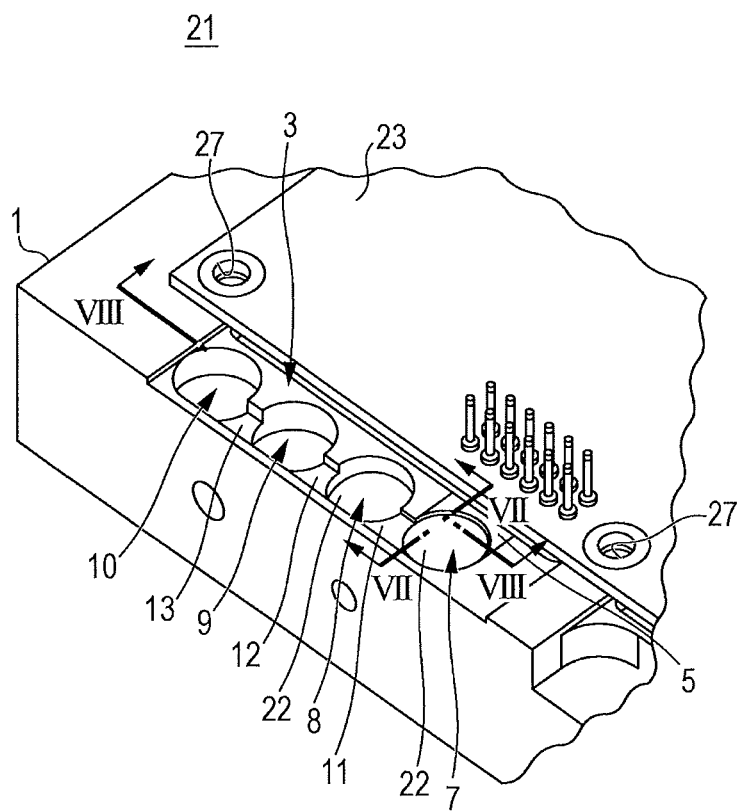
FIG. 6 illustrates a state where thermally-conductive resin is accumulated in the resin-amount check portion illustrated in FIG. 2.

FIG. 6 illustrates a state where the thermally-conductive resin 22 is accumulated in the resin-amount check portion 3 illustrated in FIG. 2. In the state illustrated in FIG. 6, the first measurement portion 7 is filled with the thermally-conductive resin 22, the thermally-conductive resin 22 is accumulated in the second measurement portion 8, and the third and fourth measurement portions 9 and 10 are empty. In FIG. 6, reference numeral 27 denotes through-holes provided in the printed circuit board 23 for inserting the screw members used for fixing the printed circuit board 23 to the heat-transfer plate 1.

Figure 7:
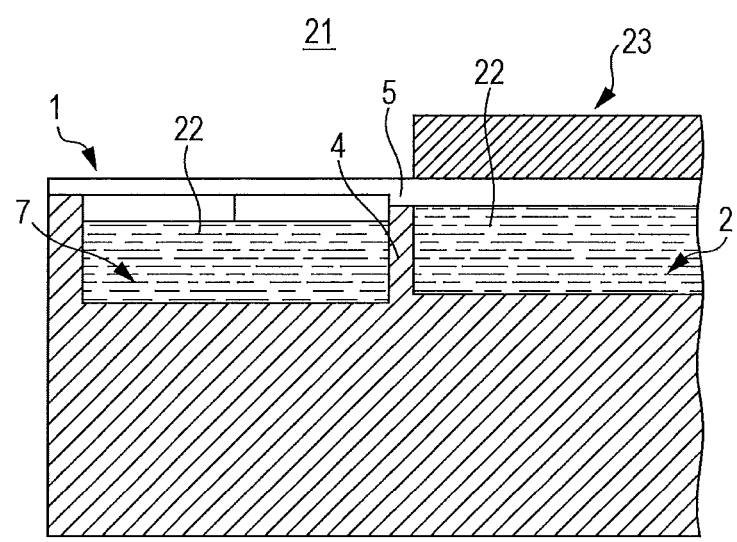
FIG. 7 is a cross-sectional view taken along a line VII-VII in FIG. 6.

FIG. 7 is a cross-sectional view taken along a line VII-VII in FIG. 6. The line VII-VII extends through the first measurement portion 7 in FIG. 6 in a direction that intersects the direction in which the first to fourth measurement portions 7 to 10 are arranged.

As illustrated in FIG. 7, in the state where the printed circuit board 23 is attached to the heat-transfer plate 1, the height of the liquid level of the thermally-conductive resin 22 in the pool portion 2 may be, for example, equal to the height of the flow channel 5 between the pool portion 2 and the first measurement portion 7. The thermally-conductive resin 22 spilling over the pool portion 2 travels through the flow channel 5 so as to flow into the first measurement portion 7.

Figure 8:
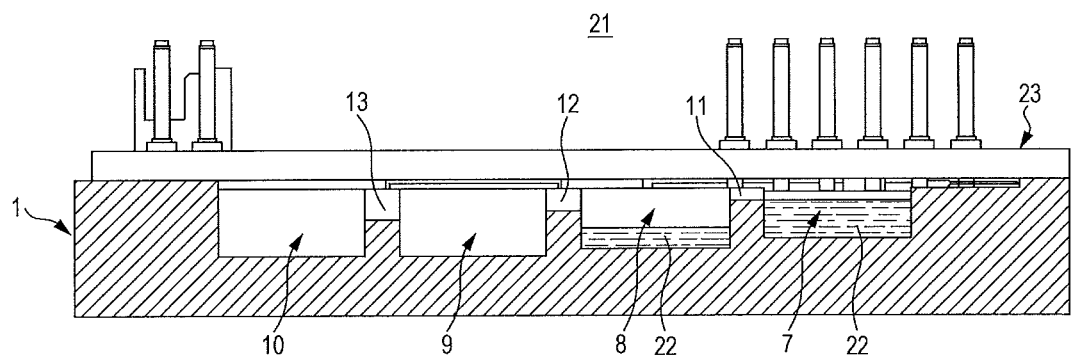
FIG. 8 is a cross-sectional view taken along a line VIII-VIII in FIG. 6.

FIG. 8 is a cross-sectional view taken along a line VIII-VIII in FIG. 6. The line VIII-VIII extends through the first to fourth measurement portions 7 to 10 in FIG. 6. As illustrated in FIG. 8, the thermally-conductive resin 22 spilling over the first measurement portion 7 travels through the second flow channel 11 between the first measurement portion 7 and the second measurement portion 8 so as to flow into the second measurement portion 8. The thermally-conductive resin 22 spilling over the second measurement portion 8 travels through the third flow channel 12 between the second measurement portion 8 and the third measurement portion 9 so as to flow into the third measurement portion 9. The thermally-conductive resin 22 spilling over the third measurement portion 9 travels through the fourth flow channel 13 between the third measurement portion 9 and the fourth measurement portion 10 so as to flow into the fourth measurement portion 10.

When assembling the heat-transfer plate module 21, the operator first measures the mass and the volume of the thermally-conductive resin 22 by using a container, such as a beaker or a graduated cylinder, and also calculates the volume of the thermally-conductive resin 22 from the mass thereof by using the specific gravity or the density of the thermally-conductive resin 22. Even if the thermally-conductive resin 22 contains an air bubble at the time of the measurement process of the thermally-conductive resin 22, the mass of the air bubble is zero. Therefore, the mass of the thermally-conductive resin 22 containing an air bubble is the same as the mass of the thermally-conductive resin 22 not containing an air bubble. Consequently, the volume calculated from, for example, the specific gravity and the measured value of the mass is equal to the volume of the thermally-conductive resin 22 not containing an air bubble.

The operator compares the measured value and the calculated value of the volume. If the measured value of the volume is larger than the calculated value, the operator may determine that the thermally-conductive resin 22 contains an air bubble at the time of the measurement process. If the measured value of the volume is equal to the calculated value, the operator may determine that the thermally-conductive resin 22 does not contain an air bubble at the time of the measurement process. If the operator determines that the thermally-conductive resin 22 contains an air bubble at the time of the measurement process, the operator performs a process for removing the air bubble from the thermally-conductive resin 22 before pouring the thermally-conductive resin 22 into the pool portion 2 of the heat-transfer plate 1.

While holding the heat-transfer plate 1 horizontally by using, for example, a level, the operator pours the thermally-conductive resin 22 not containing an air bubble into the pool portion 2 of the heat-transfer plate 1 until, for example, the liquid level of the thermally-conductive resin 22 reaches the height of the flow channel 5 in the levee portion 4. Subsequently, the operator attaches the printed circuit board 23, which is preliminarily mounted with the heating components 24, the electronic-circuit components 25, and the optical-communication components 26, to the heat-transfer plate 1 such that the heating components 24 are immersed in the thermally-conductive resin 22 in the pool portion 2.

Then, the operator checks the amount of thermally-conductive resin 22 spilling over the pool portion 2 and flowing into the resin-amount check portion 3 owing to the immersion of the heating components 24 in the thermally-conductive resin 22 in the pool portion 2. If the amount of thermally-conductive resin 22 measured at the resin-amount check portion 3 is smaller than a predetermined amount, the operator may determine that the heating components 24 are not sufficiently immersed in the thermally-conductive resin 22. One of the reasons for the insufficient immersion of the heating components 24 in the thermally-conductive resin 22 may be that the printed circuit board 23 is significantly warped, causing one or some of the heating components 24 to not come into contact with the thermally-conductive resin 22 and be set in a floating position. In this case, the operator may detach the printed circuit board 23 from the heat-transfer plate 1, unwarp the printed circuit board 23, and then attach the printed circuit board 23 to the heat-transfer plate 1 again.

If the amount of thermally-conductive resin 22 measured at the resin-amount check portion 3 is larger than the predetermined amount, the operator may determine that an air bubble is contained in the thermally-conductive resin 22 during the process of immersing the heating components 24 into the thermally-conductive resin 22. In this case, the operator may detach the printed circuit board 23 from the heat-transfer plate 1, crush the air bubble contained in the thermally-conductive resin 22 by using a sharp-ended tool, such as a nail, and then attach the printed circuit board 23 to the heat-transfer plate 1 again.

If the amount of thermally-conductive resin 22 measured at the resin-amount check portion 3 is equal to the predetermined amount, the operator fixes the printed circuit board 23 to the heat-transfer plate 1 by using the screw members. When the thermally-conductive resin 22 solidifies, the assembly process of the heat-transfer plate module 21 is completed.

According to the heat-transfer plate module 21 illustrated in FIGS. 4 to 8, the operator may check whether an air bubble is not contained in the thermally-conductive resin 22 loaded in the pool portion 2 during the attachment process of the printed circuit board 23. If the thermally-conductive resin 22 contains an air bubble, the operator may crush the air bubble and attach the printed circuit board 23 to the heat-transfer plate 1 in a state where there are no air bubbles contained in the thermally-conductive resin 22, whereby a heat-transfer plate module 21 with high thermal conductivity is obtained.

Furthermore, according to the heat-transfer plate module 21 illustrated in FIGS. 4 to 8, the operator may check whether the heating components 24 of the printed circuit board 23 are sufficiently immersed in the thermally-conductive resin 22 during the attachment process of the printed circuit board 23. If the heating components 24 are not sufficiently immersed in the thermally-conductive resin 22, the operator may unwarp the printed circuit board 23 and then attach the printed circuit board 23 to the heat-transfer plate 1, whereby a heat-transfer plate module 21 with high thermal conductivity is obtained.

Second Embodiment

Figure 9:
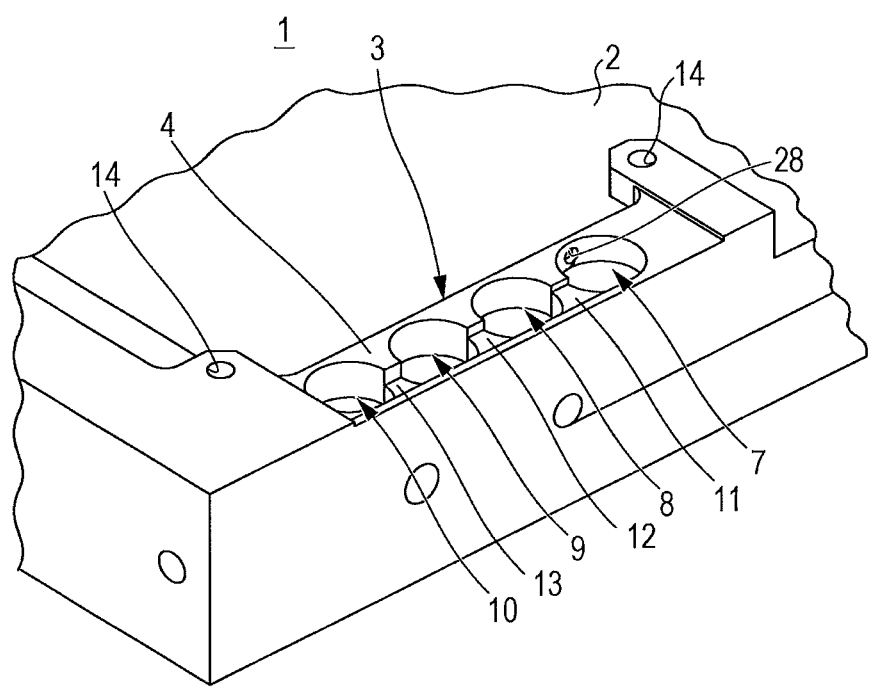
FIG. 9 illustrates a second example of the resin-amount check portion in the heat-transfer plate according to a second embodiment.
Figure 10:
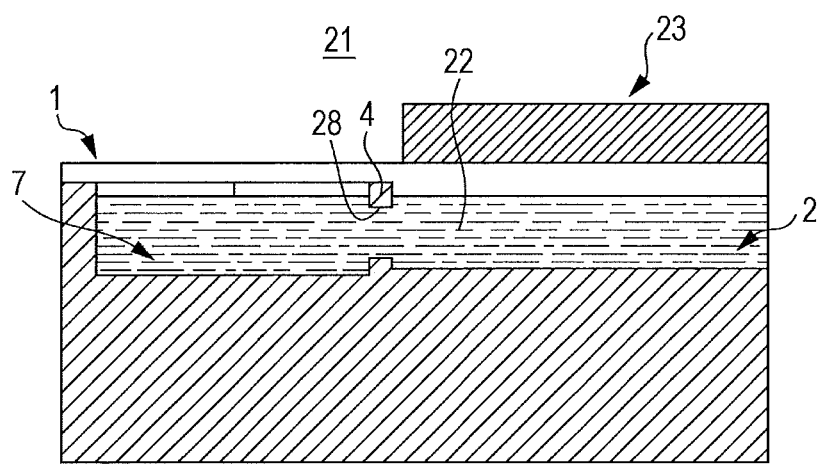
FIG. 10 illustrates a state where the thermally-conductive resin is accumulated in the resin-amount check portion illustrated in FIG. 9.

FIG. 9 illustrates a second example of the resin-amount check portion 3 in the heat-transfer plate 1 according to a second embodiment. FIG. 10 is a cross-sectional view corresponding to that taken along the line VII-VII in FIG. 6 and illustrates a state where the thermally-conductive resin 22 is accumulated in the resin-amount check portion 3 illustrated in FIG. 9. In FIG. 10, a cross portion corresponding to that taken along the line VIII-VIII in FIG. 6 is the same as that in FIG. 8.

As illustrated in FIGS. 9 and 10, in the second example of the resin-amount check portion 3, an area of the levee portion 4 located between the pool portion 2 and the first measurement portion 7 of the resin-amount check portion 3 in the heat-transfer plate 1 is provided with a through-hole serving as a flow channel 28. In other words, the pool portion 2 and the first measurement portion 7 are connected to each other via the flow channel 28. Therefore, the thermally-conductive resin 22 flows into the first measurement portion 7 from the pool portion 2 by traveling through the flow channel 28.

According to the heat-transfer plate 1 illustrated in FIG. 9 and the heat-transfer plate module 21 illustrated in FIG. 10, since the pool portion 2 and the resin-amount check portion 3 are connected to each other via the flow channel 28, the thermally-conductive resin 22 may be made to flow toward the resin-amount check portion 3 from the pool portion 2 when the heating components 24 are immersed into the thermally-conductive resin 22 in the pool portion 2.

Third Embodiment

Figure 11:
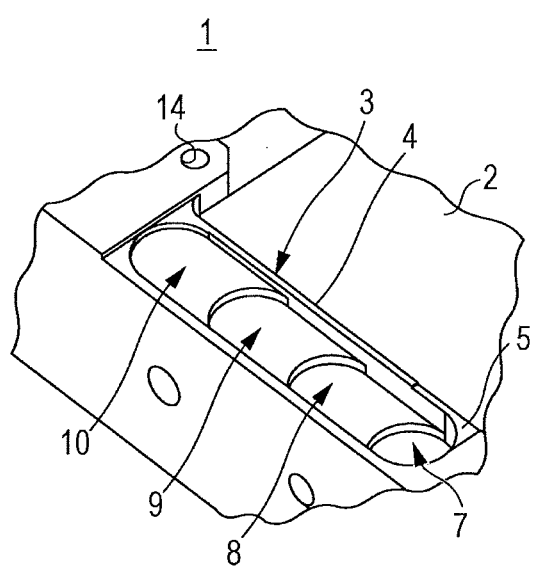
FIG. 11 illustrates a third example of the resin-amount check portion in the heat-transfer plate according to a third embodiment.
Figure 12:
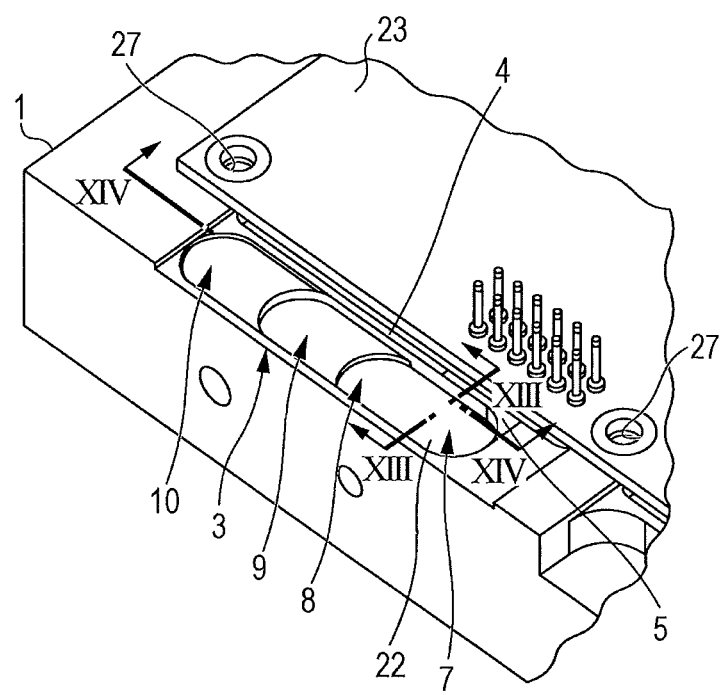
FIG. 12 illustrates a state where the thermally-conductive resin is accumulated in the resin-amount check portion illustrated in FIG. 11.
Figure 13:
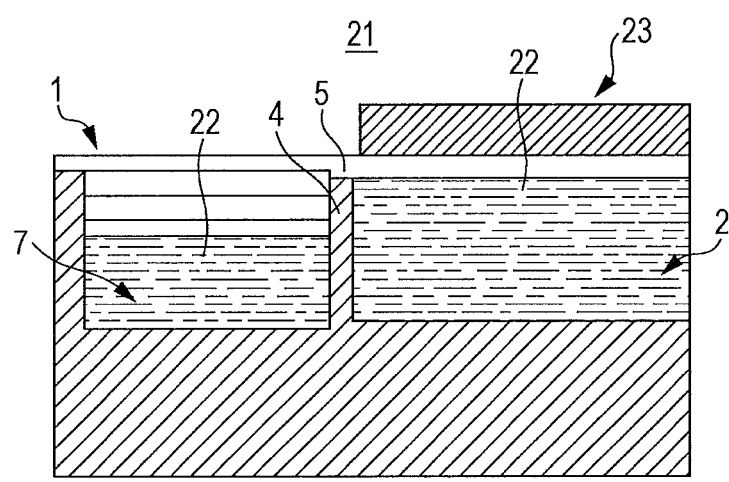
FIG. 13 is a cross-sectional view taken along a line XIII-XIII in FIG. 12.
Figure 14:
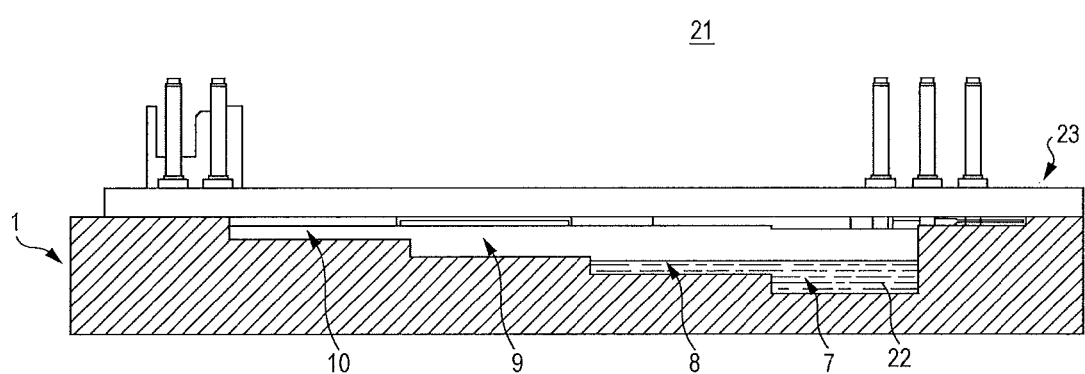
FIG. 14 is a cross-sectional view taken along a line XIV-XIV in FIG. 12.

FIG. 11 illustrates a third example of the resin-amount check portion 3 in the heat-transfer plate 1 according to a third embodiment. FIG. 12 illustrates a state where the thermally-conductive resin 22 is accumulated in the resin-amount check portion 3 illustrated in FIG. 11. FIG. 13 is a cross-sectional view taken along a line XIII-XIII in FIG. 12. The line XIII-XIII extends through the first measurement portion 7 in FIG. 12 in a direction that intersects the direction in which the first to fourth measurement portions 7 to 10 are arranged. FIG. 14 is a cross-sectional view taken along a line XIV-XIV in FIG. 12. The line XIV-XIV extends through the first to fourth measurement portions 7 to 10 in FIG. 12.

As illustrated in FIGS. 11 to 14, in the third example of the resin-amount checking portion 3, the first to fourth measurement portions 7 to 10 are provided in a stepped manner in the resin-amount check portion 3. The depths of the first to fourth measurement portions 7 to 10 vary in a stepwise fashion such that the first measurement portion 7 is the deepest and the fourth measurement portion 10 is the shallowest.

The thermally-conductive resin 22 flowing from the pool portion 2 in the heat-transfer plate 1 to the resin-amount check portion 3 by traveling through the flow channel 5, which is a low area of the levee portion 4, first accumulates in the first measurement portion 7, which is the deepest portion. When the amount of thermally-conductive resin 22 flowing into the resin-amount check portion 3 increases, the liquid level of the thermally-conductive resin 22 in the resin-amount check portion 3 rises. When the liquid level of the thermally-conductive resin 22 in the resin-amount check portion 3 reaches the bottom of the second measurement portion 8, the thermally-conductive resin 22 spreads toward the second measurement portion 8 and begins to accumulate in the second measurement portion 8. As the amount of thermally-conductive resin 22 flowing into the resin-amount check portion 3 continues to increase, the thermally-conductive resin 22 spreads toward the third measurement portion 9 and accumulates in the third measurement portion 9, and further spreads toward the fourth measurement portion 10 and accumulates in the fourth measurement portion 10.

According to the heat-transfer plate 1 illustrated in FIG. 11 and the heat-transfer plate module 21 illustrated in FIGS. 12 to 14, since the first to fourth measurement portions 7 to 10 are provided in a stepped manner in the resin-amount checking portion 3, the operator may check the amount of thermally-conductive resin 22 accumulated in the resin-amount check portion 3 during the attachment process of the printed circuit board 23. Therefore, the operator may check whether an air bubble is not contained in the thermally-conductive resin 22 loaded in the pool portion 2. Furthermore, the operator may check whether or not the heating components 24 of the printed circuit board 23 are sufficiently immersed in the thermally-conductive resin 22 in the pool portion 2.

In the third example of the resin-amount check portion 3, the pool portion 2 and the first measurement portion 7 may be connected to each other via the flow channel 28 extending through the levee portion 4, as in the second example of the resin-amount check portion 3 illustrated in FIG. 9, and the thermally-conductive resin 22 may flow toward the first measurement portion 7 from the pool portion 2 by traveling through this flow channel 28. Furthermore, in the resin-amount check portion 3, the number of measurement portions, that is, the number of steps, is not limited to four.

Fourth Embodiment

Figure 15:
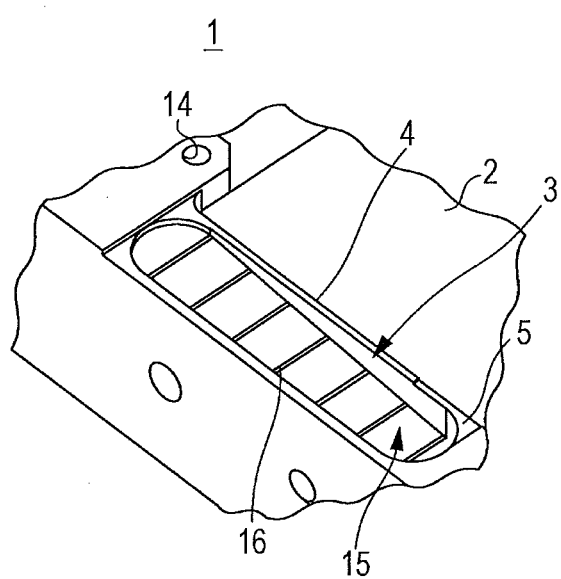
FIG. 15 illustrates a fourth example of the resin-amount check portion in the heat-transfer plate according to a fourth embodiment.
Figure 16:
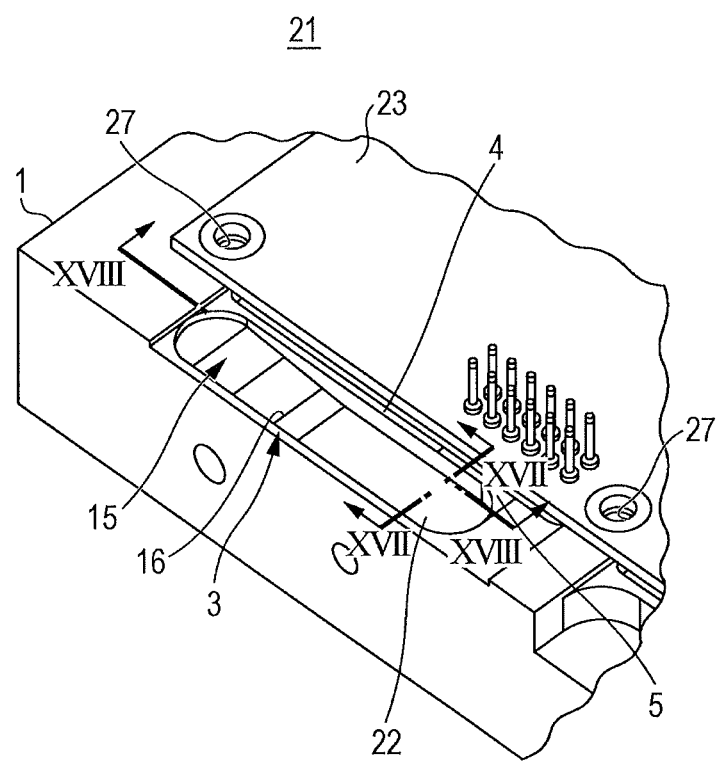
FIG. 16 illustrates a state where the thermally-conductive resin is accumulated in the resin-amount check portion illustrated in FIG. 15.
Figure 17:
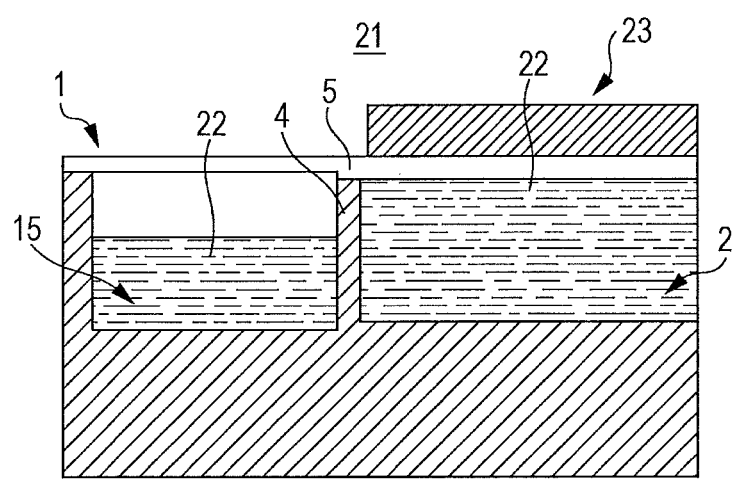
FIG. 17 is a cross-sectional view taken along a line XVII-XVII in FIG. 16.
Figure 18:
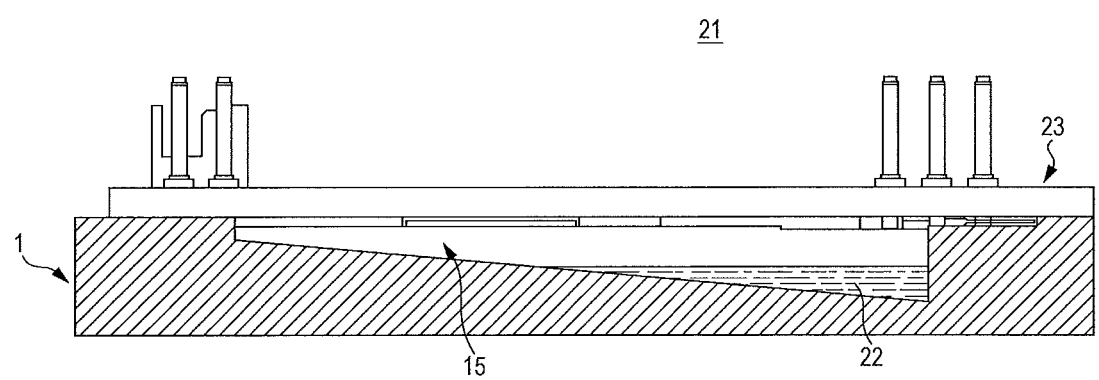
FIG. 18 is a cross-sectional view taken along a line XVIII-XVIII in FIG. 16.

FIG. 15 illustrates a fourth example of the resin-amount check portion 3 in the heat-transfer plate 1 according to a fourth embodiment. FIG. 16 illustrates a state where the thermally-conductive resin 22 is accumulated in the resin-amount check portion 3 illustrated in FIG. 15. FIG. 17 is a cross-sectional view taken along a line XVII-XVII in FIG. 16. The line XVII-XVII extends in the lateral direction of a measurement portion 15 in FIG. 16 through near the deepest area of the measurement portion 15. FIG. 18 is a cross-sectional view taken along a line XVIII-XVIII in FIG. 16. The line XVIII-XVIII extends through the measurement portion 15 in FIG. 16 in the longitudinal direction of the measurement portion 15.

As illustrated in FIGS. 15 to 18, in the fourth example of the resin-amount check portion 3, the bottom surface of the measurement portion 15 in the resin-amount check portion 3 is sloped such that an area in this measurement portion 15 into which the thermally-conductive resin 22 flows from the pool portion 2 of the heat-transfer plate 1 is the deepest. The bottom surface of the measurement portion 15 is provided with a scale 16. Alternatively, the scale 16 may be provided at a side surface of the measurement portion 15.

The thermally-conductive resin 22 flowing into the resin-amount check portion 3 from the pool portion 2 in the heat-transfer plate 1 by traveling through the flow channel 5, which is a low area of the levee portion 4, accumulates in the deep area of the measurement portion 15. When the amount of thermally-conductive resin 22 flowing into the resin-amount check portion 3 increases, the liquid level of the thermally-conductive resin 22 in the resin-amount check portion 3 rises. Then, the thermally-conductive resin 22 gradually spreads toward a shallow area of the measurement portion 15.

According to the heat-transfer plate 1 illustrated in FIG. 15 and the heat-transfer plate module 21 illustrated in FIGS. 16 to 18, since the bottom of the measurement portion 15 in the resin-amount check portion 3 is sloped and is provided with the scale 16, the operator may check the amount of thermally-conductive resin 22 accumulated in the resin-amount check portion 3 during the attachment process of the printed circuit board 23. Therefore, the operator may check whether an air bubble is not contained in the thermally-conductive resin 22 loaded in the pool portion 2. Furthermore, the operator may check whether or not the heating components 24 of the printed circuit board 23 are sufficiently immersed in the thermally-conductive resin 22 in the pool portion 2.

In the fourth example of the resin-amount check portion 3, the pool portion 2 and the measurement portion 15 may be connected to each other via the flow channel 28 extending through the levee portion 4, as in the second example of the resin-amount check portion 3 illustrated in FIG. 9, and the thermally-conductive resin 22 may flow toward the measurement portion 15 from the pool portion 2 by traveling through this flow channel 28.

Fifth Embodiment

The heat-transfer plate 1 or the heat-transfer plate module 21 illustrated in FIGS. 1 to 18 have the printed circuit board 23 mounted with the heating components 24 and may be used in an apparatus, such as an electronic apparatus, in which cooling of the heating components 24 is desired. For example, the heat-transfer plate 1 or the heat-transfer plate module 21 illustrated in FIGS. 1 to 18 may be used in an apparatus in which cooling of the heating components 24 by using a fan is difficult. An example of such an apparatus in which cooling of the heating components 24 by using a fan is difficult includes an apparatus having a lifespan that is longer than that of a fan motor, such as a submarine apparatus that serves as an optical relay apparatus used in an optical transmission system and that relays an optical signal at the seafloor.

Figure 19:
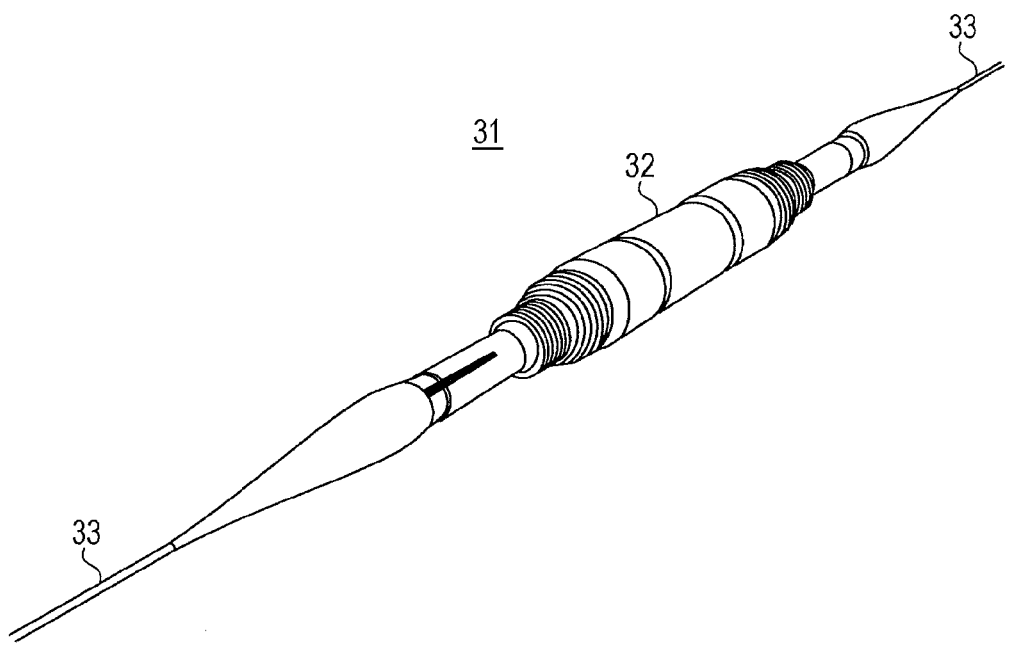
FIG. 19 illustrates an example of a submarine apparatus according to a fifth embodiment.

FIG. 19 illustrates an example of a submarine apparatus 31 according to a fifth embodiment. As illustrated in FIG. 19, in the submarine apparatus 31, the above-described heat-transfer plate module 21 is sealed within a housing 32 that is resistant to pressure. Both ends of the submarine apparatus 31 are connected to submarine cables 33 each having a bundle of optical fibers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A heat-transfer plate that is fixed to a printed circuit board mounted with a heating component and that radiates heat from the heating component, the heat-transfer plate comprising:
    a pool portion configured to have a partially-depressed surface and to be loaded with thermally-conductive resin that is in contact with the heating component so as to transfer the heat from the heating component to the heat-transfer plate;
    a resin-amount check portion configured to have a plurality of depths and to be disposed at a position where the thermally-conductive resin is viewable in a state where the printed circuit board is fixed to the heat-transfer plate;
    a levee portion configured to be provided between the pool portion and the resin-amount check portion and to suppress flow of the thermally-conductive resin toward the resin-amount check portion; and
    a flow channel configured to be provided between the pool portion and the resin-amount check portion and to serve as a path through which the thermally-conductive resin flowing into the resin-amount check portion from the pool portion travels.

2. The heat-transfer plate according to claim 1, wherein the resin-amount check portion has a plurality of recessed measurement portions having different depths.

3. The heat-transfer plate according to claim 1, wherein the resin-amount check portion has a stepped measurement portion.

4. The heat-transfer plate according to claim 1, wherein the resin-amount check portion has a measurement portion whose bottom is sloped and a scale that indicates an amount of the thermally-conductive resin.

5. The heat-transfer plate according to claim 1, wherein a part of the levee portion is lower than a periphery of the pool portion, and the part of the levee portion that is lower than the periphery of the pool portion serves as the flow channel.

6. The heat-transfer plate according to claim 1, wherein the flow channel is a hole that extends through the levee portion and connects the pool portion and the resin-amount check portion.

7. A heat-transfer plate module comprising:
    a heat-transfer plate configured to radiate heat from a heating component including
    a pool portion configured to have a partially-depressed surface and to be loaded with thermally-conductive resin that is in contact with the heating component so as to transfer the heat from the heating component to the heat-transfer plate,
    a resin-amount check portion configured to have a plurality of depths and to be disposed at a position where the thermally-conductive resin is viewable in a state where the printed circuit board is fixed to the heat-transfer plate,
    a levee portion configured to be provided between the pool portion and the resin-amount check portion and to suppress flow of the thermally-conductive resin toward the resin-amount check portion, and
    a flow channel configured to be provided between the pool portion and the resin-amount check portion and to serve as a path through which the thermally-conductive resin flowing into the resin-amount check portion from the pool portion travels; and
    a printed circuit board configured to be mounted with the heating component and to be fixed to the heat-transfer plate.

8. A submarine apparatus comprising:
    a housing; and
    a heat-transfer plate module sealed within the housing, including
    a heat-transfer plate configured to radiate heat from a heating component including
    a pool portion configured to have a partially-depressed surface and to be loaded with thermally-conductive resin that is in contact with the heating component so as to transfer the heat from the heating component to the heat-transfer plate,
    a resin-amount check portion configured to have a plurality of depths and to be disposed at a position where the thermally-conductive resin is viewable in a state where the printed circuit board is fixed to the heat-transfer plate,
    a levee portion configured to be provided between the pool portion and the resin-amount check portion and to suppress flow of the thermally-conductive resin toward the resin-amount check portion, and a flow channel configured to be provided between the pool portion and the resin-amount check portion and to serve as a path through which the thermally-conductive resin flowing into the resin-amount check portion from the pool portion travels; and a printed circuit board configured to be mounted with the heating component and to be fixed to the heat-transfer plate.

* * * * *